3,157,473

ELECTRICAL CONNECTIONS TO THIN CONDUCTIVE LAYERS

John Reginald Acton, Kegworth, England, assignor to Ericsson Telephones Limited, London, England, a British company No Drawing. Filed Apr. 2, 1962, Ser. No. 184,499
Claims priority, application Great Britain, Apr. 7, 1961, 12,565/61
4 Claims. (Cl. 29—183.5)

This invention relates to electrical connections to thin layers of conductive material.

In certain types of electrical apparatus it has become the custom to use conductive material in thin layers. These layers may be formed on a carrier stratum by spraying a surface of the stratum with the conductive material, or by vapour deposition of the conductive material on a surface of the stratum under reduced pressure.

In this specification the adjective "thin" when applied to "layer" or "layers" is to be read as meaning a layer thickness of the order normally obtained by either of the processes mentioned, whether or not the layer referred to was produced by either of these processes. The thickness of such a layer will be between 0.01 micron and 25 microns.

Hitherto difficulty has been experienced in establishing electrical connection between a thin layer of conductive material and a conductor such as a wire especially if the carrier stratum is of an epoxy resin which will not withstand temperatures much in excess of 340° F. A method commonly used is to mix silver powder with an epoxy resin which is allowed to set and seal the wire to the layer. When passing a current, and particularly when the current is first switched on, sparks may be observed within the resin; and after repeated switchings the electrical connection is liable to fail even though the adhesive action of the resin has not deteriorated.

According to the invention there is provided an electric connection between a conductor and a thin layer of conductive material carried on a carrier stratum of epoxy resin comprising a relatively massive substantially homogeneous bond adhering to both the conductor and the layer, which bond includes indium. The term "massive" is to be taken as indicating thicknesses between 100 microns and 5000 microns.

Connections as described in the preceding paragraph are easily made and durable.

In making the connections, conventional soldering techniques are employed to form the bonds. The bond is composed of the material used for the soldering process. This material is preferably pure indium though a suitable solder containing indium may be used. The bond closely resembles a soldered connection. The most suitable indium solders are eutectic alloys of indium with either silver or tin. These alloys have melting points of 302° F. and 239° F. respectively. Slight variations from the eutectic composition are, of course, possible. The bond is massive in relation to the thickness of the thin conductive layer, and may be massive in relation to the dimensions of the conductor, e.g. to the diameter of the wire if the conductor is a wire. The bond however is distinguishable from those described in co-pending application Serial No. 184,117 in that it consists of a single material adhering to both the conductor and the thin layer.

The thin layer may be copper, silver or gold carried on a stratum composed wholly or mainly of epoxy resin. Connections according to the present invention may be used with electroluminescent panels in the manner described with reference to FIGURE 3 of the specification mentioned above.

What is claimed is:

1. An electrical connection between an electrical metallic conductor and a thin layer of conductive material selected from the group consisting of copper, silver and gold bonded to a layer of epoxy resin, comprising a relatively massive homogeneous bond adhering to both the thin layer of conductive material and the conductor, the thickness of said layer being in the range of from 0.01 micron to 25 microns, the thickness of said massive bond being in the range of from 100 microns to 5000 microns, said bond being formed of a metal selected from the group consisting of indium, a eutectic alloy of indium and silver, and a eutectic alloy of indium and tin.

2. An electrical connection as defined in claim 1 wherein said metallic composition consists entirely of indium.

3. An electrical connection as defined in claim 1 wherein said metallic composition is a eutectic alloy of indium and silver.

4. An electrical connection as defined in claim 1 wherein said metallic composition is a eutectic alloy of indium and tin.

References Cited by the Examiner

UNITED STATES PATENTS

| | | | |
|---|---|---|---|
| 2,520,310 | 8/50 | Frazier | 29—199 X |
| 2,700,212 | 1/55 | Flynn | 29—195 |
| 2,746,140 | 5/56 | Belser | 29—473.1 |
| 2,802,897 | 8/57 | Huhd | 29—195 |

OTHER REFERENCES

"Indium Alloys Finding Important Commercial Use," pages 113–115, Materials and Methods, September 1952, by Jaffee et al.

DAVID L. RECK, *Primary Examiner.*

ROGER L. CAMPBELL, HYLAND BIZOT, *Examiners.*